United States Patent
Ueno et al.

(10) Patent No.: US 8,901,522 B2
(45) Date of Patent: Dec. 2, 2014

(54) CHAMBER APPARATUS AND EXTREME ULTRAVIOLET LIGHT GENERATION SYSTEM

(75) Inventors: Yoshifumi Ueno, Hiratsuka (JP); Shinji Nagai, Hiratsuka (JP); Osamu Wakabayashi, Hiratsuka (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 13/196,311

(22) Filed: Aug. 2, 2011

(65) Prior Publication Data
US 2011/0284775 A1 Nov. 24, 2011

Related U.S. Application Data

(63) Continuation of application No. PCT/JP2011/050574, filed on Jan. 14, 2011.

(30) Foreign Application Priority Data

Feb. 22, 2010 (JP) .................. 2010-036042
Jan. 6, 2011 (JP) .................. 2011-001508

(51) Int. Cl.
*H05G 2/00* (2006.01)
*G21K 5/00* (2006.01)
*G03F 7/20* (2006.01)

(52) U.S. Cl.
CPC ............ *H05G 2/003* (2013.01); *G03F 7/70033* (2013.01); *G03F 7/70916* (2013.01); *H05G 2/008* (2013.01)
USPC .................... 250/504 R; 250/493.1

(58) Field of Classification Search
USPC ....... 250/396 ML, 504 R, 493.1; 315/111.21, 315/111.41, 111.71
See application file for complete search history.

(56) References Cited

U.S. PATENT DOCUMENTS

| | | |
|---|---|---|
| 4,886,969 A | 12/1989 | Knauer |
| 7,087,914 B2 | 8/2006 | Akins et al. |
| 7,164,144 B2 | 1/2007 | Partlo et al. |

(Continued)

FOREIGN PATENT DOCUMENTS

| | | |
|---|---|---|
| JP | 01-265443 A | 10/1989 |
| JP | 08-017371 A | 1/1996 |

(Continued)

OTHER PUBLICATIONS

English translation of International Search Report issued in International Patent Application No. PCT/JP2011/050574, dated Mar. 15, 2011.

*Primary Examiner* — Jack Berman
*Assistant Examiner* — David E Smith
(74) *Attorney, Agent, or Firm* — McDermott Will & Emery LLP

(57) ABSTRACT

A chamber apparatus used with a laser apparatus may include: a chamber provided with at least one inlet through which a laser beam outputted from the laser apparatus enters the chamber; a target supply unit provided to the chamber for supplying a target material to a predetermined region inside the chamber; a magnetic field generation unit for generating a magnetic field in the predetermined region; and a charged particle collection unit disposed in a direction of a magnetic flux of the magnetic field for collecting a charged particle thereinto, the charged particle being generated when the target material is irradiated with the laser beam inside the chamber and traveling along the magnetic flux.

7 Claims, 11 Drawing Sheets

(56) References Cited

U.S. PATENT DOCUMENTS

| | | |
|---|---|---|
| 7,217,941 B2 | 5/2007 | Rettig et al. |
| 7,251,012 B2 | 7/2007 | Banine et al. |
| 7,525,111 B2 | 4/2009 | Bowering |
| 2006/0109436 A1 | 5/2006 | Van Der Laan et al. |
| 2006/0186356 A1* | 8/2006 | Imai et al. .................. 250/504 R |
| 2006/0249698 A1* | 11/2006 | Endo et al. ................. 250/504 R |
| 2009/0257053 A1 | 10/2009 | Smirnov et al. |
| 2009/0261242 A1* | 10/2009 | Ueno et al. .................... 250/283 |
| 2009/0272919 A1* | 11/2009 | Abe et al. ................... 250/504 R |
| 2010/0032590 A1* | 2/2010 | Bykanov et al. ........... 250/504 R |
| 2010/0051831 A1* | 3/2010 | Tao et al. ................... 250/504 R |
| 2010/0176312 A1* | 7/2010 | Komori et al. ............. 250/504 R |
| 2010/0213395 A1* | 8/2010 | Ueno et al. ................. 250/504 R |

FOREIGN PATENT DOCUMENTS

| | | |
|---|---|---|
| JP | 10-221499 A | 8/1998 |
| JP | 10-223395 A | 8/1998 |
| JP | 2001-217096 A | 8/2001 |
| JP | 2005-197456 A | 7/2005 |
| JP | 2006-080255 A | 3/2006 |
| JP | 2006-148137 A | 6/2006 |
| JP | 2008-277481 A | 11/2008 |
| JP | 2009-258736 A | 11/2009 |
| WO | WO 2008/063825 A1 | 5/2008 |

* cited by examiner

CHAMBER APPARATUS AND EXTREME ULTRAVIOLET LIGHT GENERATION SYSTEM

CROSS-REFERENCE TO RELATED APPLICATIONS

This application is a continuation of International Application No. PCT/JP2011/050574 filed Jan. 14, 2011, which claims priority from Japanese Patent Application No. 2010-036042 filed Feb. 22, 2010, and Japanese Patent Application No. 2011-001508 filed Jan. 6, 2011.

BACKGROUND

1. Technical Field

This disclosure relates to a chamber apparatus and an extreme ultraviolet (EUV) light generation system.

2. Description of Related Art

In recent years, as semiconductor processes become finer, photolithography has been making rapid progress toward finer fabrication. In the next generation, microfabrication at 70 nm to 45 nm, and further, microfabrication at 32 nm and beyond will be required. Accordingly, in order to fulfill the requirement for microfabrication at 32 nm and beyond, for example, an exposure apparatus is expected to be developed where an EUV light generation system for generating EUV light at a wavelength of approximately 13 nm is combined with reduced projection reflective optical system.

Three types of light generation systems are generally known, which include an LPP (laser produced plasma) type system in which plasma generated by irradiating a target material with a laser beam is used, a DPP (discharge produced plasma) type system in which plasma generated by electric discharge is used, and an SR (synchrotron radiation) type system in which orbital radiation is used.

SUMMARY

A chamber apparatus according to one aspect of this disclosure may be used with a laser apparatus, and the chamber apparatus may include: a chamber provided with at least one inlet through which a laser beam outputted from the laser apparatus enters the chamber; a target supply unit provided to the chamber for supplying a target material to a predetermined region inside the chamber; a magnetic field generation unit for generating a magnetic field in the predetermined region; and a charged particle collection unit disposed in a direction of a magnetic flux of the magnetic field for collecting a charged particle thereinto, the charged particle being generated when the target material is irradiated with the laser beam inside the chamber and traveling along the magnetic flux.

A chamber apparatus according to another aspect of this disclosure may be used with a laser apparatus and an external apparatus having an obscuration region, and the chamber apparatus may include: a chamber provided with at least one inlet through which a laser beam outputted from the laser apparatus enters the chamber; a target supply unit provided to the chamber for supplying a target material to a predetermined region inside the chamber; a magnetic field generation unit for generating a magnetic field in the predetermined region; a charged particle collection unit disposed in a direction of a magnetic flux of the magnetic field for collecting a charged particle thereinto, the charged particle being generated when the target material is irradiated with the laser beam inside the chamber and traveling along the magnetic flux; and a collector mirror disposed inside the chamber for collecting extreme ultraviolet light emitted when the target material is irradiated with the laser beam inside the chamber.

An extreme ultraviolet light generation system according to yet another aspect of this disclosure may include: either of the above chamber apparatuses; and a laser apparatus.

These and other objects, features, aspects, and advantages of this disclosure will become apparent to those skilled in the art from the following detailed description, which, taken in conjunction with the annexed drawings, discloses preferred embodiments of this disclosure.

DESCRIPTION OF PREFERRED EMBODIMENTS

Figure 1:
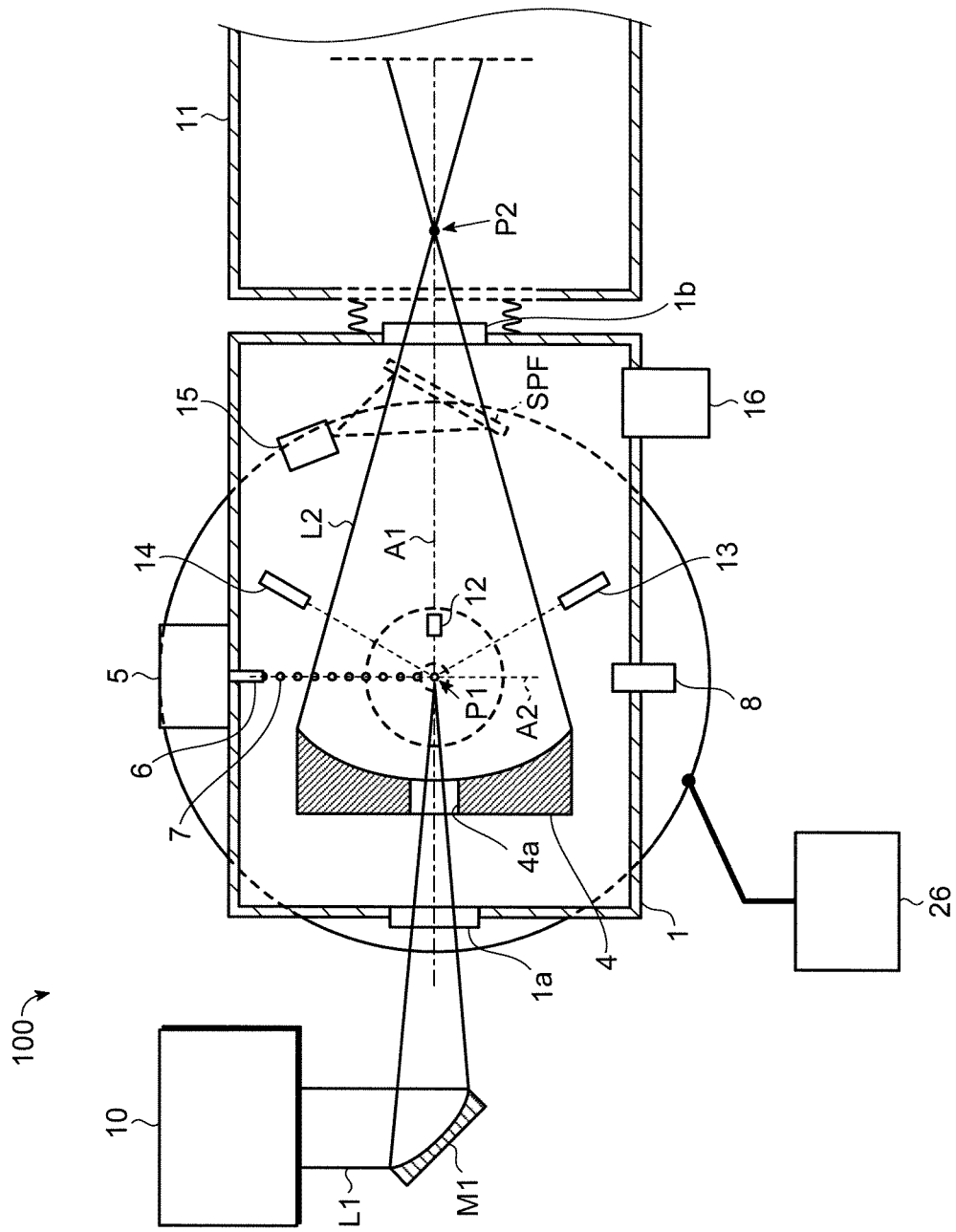
FIG. 1 is a sectional view, taken along a plane containing the axis of the EUV light, schematically illustrating the configuration of an EUV light generation system according to a first embodiment of this disclosure.

Hereinafter, embodiments for implementing this disclosure will be described in detail with reference to the accompanying drawings. In the subsequent description, each drawing merely illustrates shape, size, positional relationship, and so on, schematically to the extent that enables the content of this disclosure to be understood; thus, this disclosure is not limited to the shape, the size, the positional relationship, and so on, illustrated in each drawing. In order to show the configuration clearly, part of hatching along a section is omitted in the drawings. Further, numerical values indicated hereafter are merely preferred examples of this disclosure; thus, this disclosure is not limited to the indicated numerical values.

First Embodiment

Figure 2:
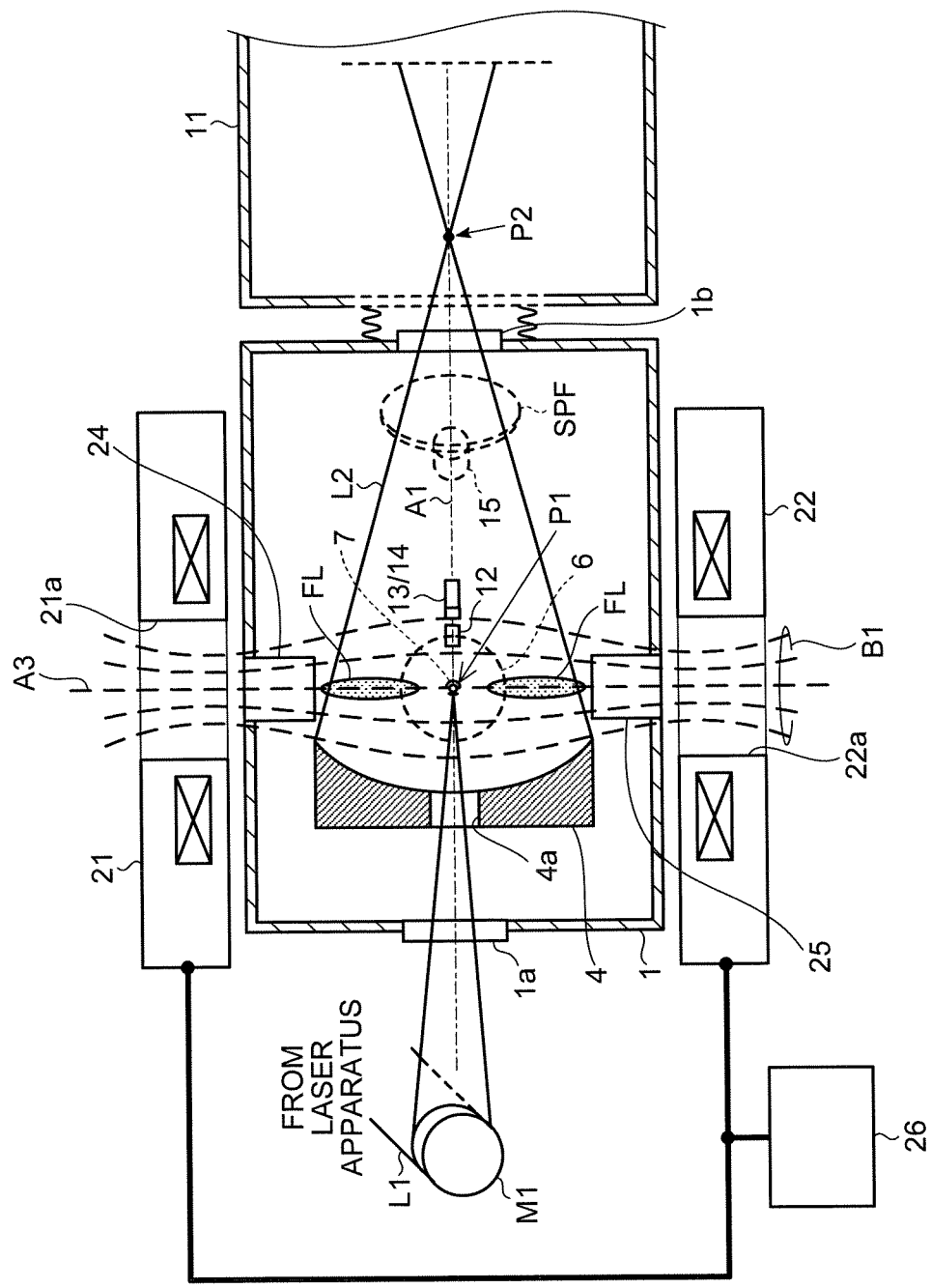
FIG. 2 is a sectional view, taken along a plane containing the axis of the EUV light and perpendicular to the plane of FIG. 1, schematically illustrating the configuration of the EUV light generation system according to the first embodiment.
Figure 3:
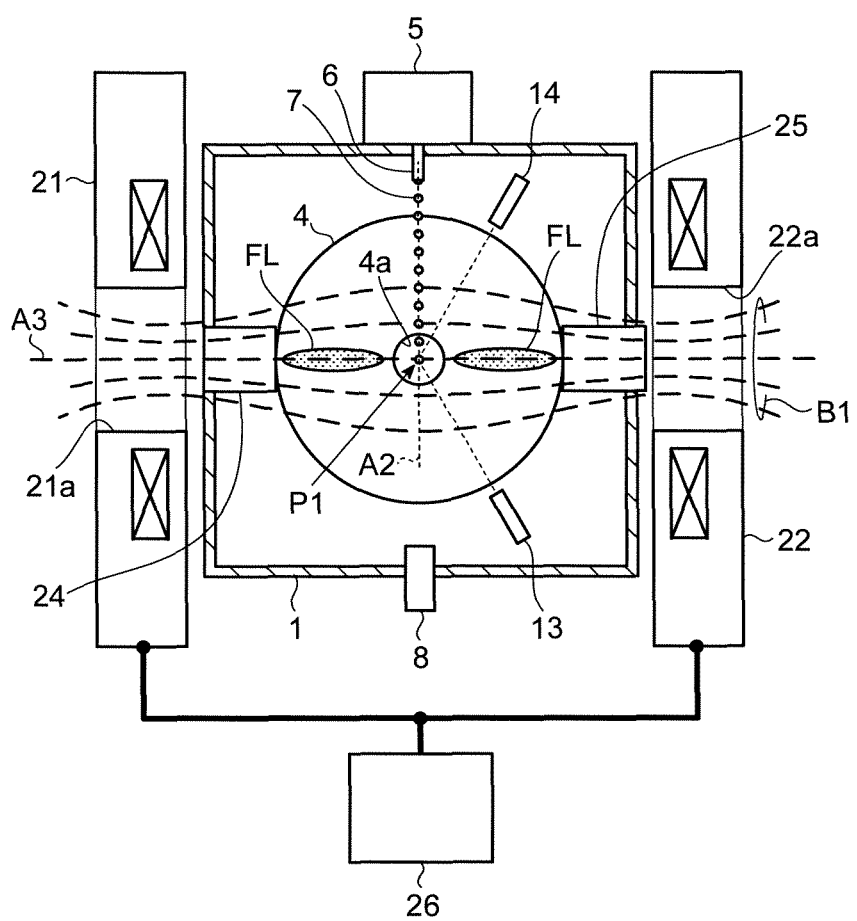
FIG. 3 is a sectional view, taken along a plane containing a plasma generation region and perpendicular to the axis of the EUV light, schematically illustrating the EUV light generation system according to the first embodiment.

An EUV light generation system according to a first embodiment of this disclosure will be described in detail with reference to the drawings. FIG. 1 is a sectional view, taken along a plane containing the axis of EUV light, schematically illustrating the EUV light generation system according to the first embodiment. FIG. 2 is a sectional view, taken along a plane containing the axis of the EUV light and perpendicular to the plane of FIG. 1, schematically illustrating the configuration of the EUV light generation system according to the first embodiment. FIG. 3 is a sectional view, taken along a plane containing a plasma generation region and perpendicular to the axis of the EUV light, schematically illustrating the EUV light generation system shown in FIG. 1.

As illustrated in FIG. 1, an EUV light generation system 100 according to the first embodiment may include a laser apparatus 10, a highly air-tight chamber 1, a window 1a, and an off-axis paraboloidal mirror M1. The laser apparatus 10 may output a laser beam L1, with which a target material serving as a source of generating EUV light L2 is irradiated to thereby be turned into plasma. The chamber 1 may define a space in which the EUV light L2 is generated. The window 1a may seal the chamber 1 so as to maintain the airtightness thereinside, and the laser beam L1 outputted from the laser apparatus 10 may travel through the window 1 into the chamber 1. The paraboloidal mirror M1 may focus, via the window 1a, the laser beam L1 outputted from the laser apparatus 10 in a plasma generation region P1 defined inside the chamber 1.

The EUV light generation system 100 may further include a discharge pump 16, a molten tin tank 5, a nozzle 6, a droplet collection unit 8, an EUV collector mirror 4, and a vacuum gate valve 1b. The discharge pump 16 may be connected to the chamber 1. The molten tin tank 5 may store molten tin (Sn), which serves as a target material, in a liquid state. The nozzle 6 may project into the chamber 1 from the molten tin tank 5. The target material may be outputted, as a droplet 7, through the nozzle 6 so as to pass the plasma generation region P1. The molten tin tank 5 and the nozzle 6 may constitute a target supply unit. Among the droplets 7 outputted through the nozzle 6, droplets 7 that have not been irradiated with the laser beam L1 or droplets 7 that have not been turned into plasma even when irradiated with the laser beam L1 may be collected into the droplet collection unit 8. The EUV collector mirror 4 may reflect the EUV light L2 emitted when the droplet 7 is irradiated with the laser beam L1 in the plasma generation region P1 and turned into plasma, such that the EUV light L2 is focused at an intermediate focus P2 inside an EUV exposure apparatus 11 disposed outside the chamber 1. The vacuum gate valve 1b may airtightly seal the chamber 1, and the EUV light L2 reflected by the EUV collector mirror 4 may be outputted to the EUV exposure apparatus 11 disposed outside the chamber 1 through the vacuum gate valve 1b.

The EUV light generation system 100 may further include a control camera 14, an EUV light measuring unit 13, a spectral purity filter SPF, and a reflected-focused-EUV-light measuring unit 15. The control camera 14 may be used to control the timing at which the droplet 7 is outputted and the timing at which the laser beam L1 is outputted so that the droplet 7 is reliably irradiated with the laser beam L1 in the plasma generation region P1. The EUV light measuring unit 13 may measure the intensity, the wavelength, and so forth, of the EUV light L2 emitted in the plasma generation region P1. The spectral purity filter SPF may reflect part of the EUV light L2 that has been collected and reflected by the EUV collector mirror 4. The reflected-focused-EUV-light measuring unit 15 may measure the intensity, the wavelength, and so forth, of the EUV light L2 that has been reflected by the spectral purity filter SPF.

The discharge pump 16 may be a turbo-molecular pump, for example. The beam axis of the laser beam L1 reflected by the off-axis paraboloidal mirror M1 may preferably coincide with the axis A1 of the EUV light L2 reflected by the EUV collector mirror 4, for example. Thus, the EUV collector mirror 4 may be provided with a through-hole 4a formed, for example, at the center thereof, through which the laser beam L1 may travel from the rear side of the EUV collector mirror 4 to strike the droplet 7. A beam dump 12 may be disposed on the extension of the line connecting substantially the center of the through-hole 4a and the plasma generation region P1. The beam dump 12 may prevent the laser beam L1 that has not struck the droplet 7 or the laser beam L1 diffusely reflected by the droplet 7 from entering the EUV exposure apparatus 11.

As illustrated in FIGS. 2 and 3, the EUV light generation system 100 may further include a pair of electromagnetic coils 21 and 22, an excitation power source 26, and ion collection units 24 and 25. The pair of electromagnetic coils 21 and 22 may be used to generate a magnetic field B1, with which charged particles including tin ions (hereinafter, simply referred to as ions) generated in the plasma generation region P1 may be trapped in a predetermined region and be guided in a predetermined direction. The excitation power source 26 may supply electric current to the electromagnetic coils 21 and 22, with which the magnetic field B1 may be generated. The ions trapped in the magnetic field B1 may be collected into the ion collection units 24 and 25. The electromagnetic coils 21 and 22 and the excitation power source 26 may in cooperation function as a magnetic field generation unit. The magnetic field generation unit may generate the magnetic field B1, with which the ions generated when the droplet 7 is irradiated with the laser beam L1 may be converged into an ion flow FL, which may drift along the center (hereinafter, referred to central axis A3) of the magnetic flux of the magnetic field B1. The ion collection units 24 and 25 may function as a charge particle collection unit disposed at positions toward which the ion flow FL may drift along the central axis A3 from the plasma generation region P1.

The magnetic field B1 may be formed such that the central axis A3 extends from the center of a magnet bore 21a of the electromagnetic coil 21 at one side to the center of a magnetic bore 22a of the electromagnetic coil 22 at the other side. The ions trapped in the magnetic field B1 may be subjected to the Lorentz force of the magnetic field B1, whereby the ions may converge within a range determined by the magnetic flux density of the magnetic field B1 and may form the ion flow FL that drifts along the central axis A3 from the plasma generation region P1. The ion flow FL may drift toward the ion collection unit 24 or 25. The magnetic field generation unit constituted of the electromagnetic coils 21 and 22 and the excitation power source 26 may preferably generate the magnetic field B1 having predetermined magnetic flux density, at which a cross-section of the ion flow FL at the position where the ion flow FL is incident on respective surfaces (incident openings) of the ion collection units 24 and 25 can substantially be smaller than the respective areas (incident openings) of the ion collection units 24 and 25 onto which the ion flow FL is incident. With this, substantially the entirety of the ions generated in the plasma generation region P1 may be collected into either of the ion collection units 24 and 25. The ions collected into the ion collection units 24 and 25 may be re-used, for example, as the target material (molten or solid tin). Alternatively, the ions may be stored or discarded.

Figure 4:
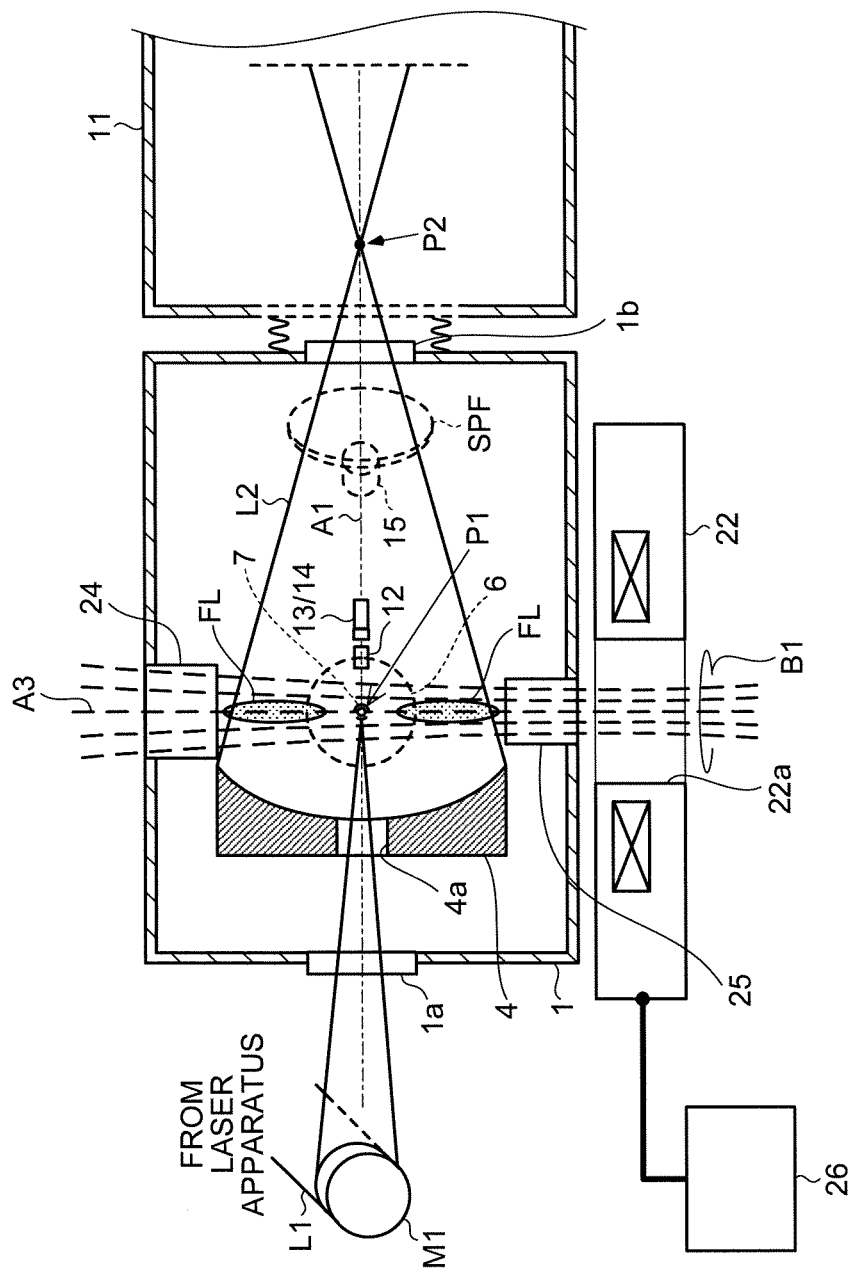
FIG. 4 is a sectional view, taken along a plane containing the axis of the EUV light, schematically illustrating the configuration of an EUV light generation system according to a modification of the first embodiment.

The EUV light generation system according to the first embodiment may be configured such that a magnetic field for trapping the ions is generated across the plasma generation region P1 with a single electromagnetic coil 22, as illustrated in FIG. 4. FIG. 4 schematically illustrates the configuration of an EUV light generation system according to a modification of the first embodiment. According to the modification shown in FIG. 4, when the plasma is generated in the plasma generation region P1, the ions may be trapped in the magnetic field and may travel in the direction of the magnetic field. The magnetic flux density of the magnetic field may be higher at the side where the electromagnetic coil 22 is disposed with respect to the plasma generation region P1; whereas, the magnetic flux density of the magnetic field may be lower at the side where the electromagnetic coil 22 is not disposed with respect to the plasma generation region P1. Accordingly, the opening in the ion collection unit 24, disposed at the side where the electromagnetic coil 22 is not disposed with respect to the plasma generation region P1, may preferably be set larger than the opening in the ion collection unit 25, disposed at the side where the electromagnetic coil 22 is disposed with respect to the plasma generation region P1, in accordance with the state of the magnetic flux density. In this way, in the modification, the sizes of the openings in the ion collection units 24 and 25 may be adjusted in accordance with the state of the magnetic flux density.

In the first embodiment, as illustrated in FIG. 3, for example, a case where an output axis A2 of the droplet 7 intersects perpendicularly to the central axis A3 of the magnetic field B1 in the plasma generation region P1 has been illustrated as an example. However, without being limited thereto, the output axis A2, for example, may intersect with the central axis A3 at an acute angle of 30 degrees or smaller in the plasma generation region P1. This, for example, makes it possible to configure the ion collection unit 25 to function as a droplet collection unit as well. If this is the case, the droplet collection unit 8 shown in FIGS. 1 and 3 may be omitted. Further, although the tin droplet 7 has been illustrated as an example of the target serving as a source of generating the EUV light L2, without being limited thereto, a solid tin target (tin plate 107) as shown in FIG. 5 discussed later may be employed instead, for example.

The size (diameter) of the cross-section of the ion flow FL formed when the ions are trapped in the magnetic field B1 may vary in accordance with the magnetic flux density; that is, the smaller the magnetic flux density is, the larger the diameter becomes, and the larger the magnetic flux density is, the smaller the diameter becomes. The relationship between the magnetic flux density of the magnetic field generated with the electromagnetic coils and the diameter of the ion flow formed with the tin trapped in the magnetic field will be described below with a specific example. FIG. 5 schematically illustrates an experimental unit used to observe the relationship between the diameter of the ion flow and the magnetic flux density of the magnetic field generated with the electromagnetic coils according to the first embodiment. This experimental unit may include a single magnet of a superconductive magnet 121 (corresponding to the electromagnet coils 21 and 22) for generating a magnetic field corresponding to the magnetic field B1. The tin plate 107 (corresponding to the droplet 7) serving as the source of generating the EUV light L2 has been used as the target. The tin plate 107 has been irradiated with a focused laser beam L101, whereby plasma has been generated in a plasma generation region P101 and EUV light has been emitted from the plasma. Ions generated from the plasma at this time have been trapped in the magnetic field generated with the superconductive magnet 121. The ions trapped in the magnetic field have formed an ion flow FL101 (corresponding to the ion flow FL). The ion flow FL101 has been made to strike a fluorescent screen PS as an ion beam, whereby the fluorescent screen PS has been made to emit light. The emission area has been observed with a CCD camera 115, and an ion spot size $P_{ion}$ of the ion flow FL101 has been measured. Meanwhile, when the amount of ions in the ion flow FL101 is to be measured, the fluorescent screen may be removed, and the ion beam may be made directly incident on a Faraday cup FC, whereby the amount of the ions may be measured.

Figure 5:
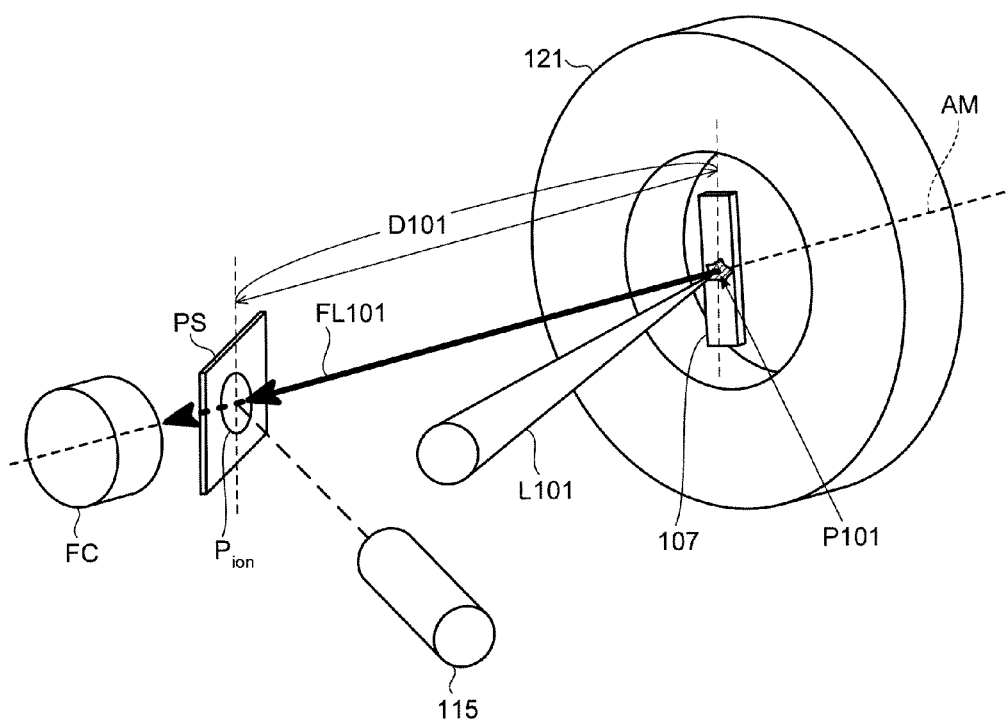
FIG. 5 is a schematic diagram illustrating a specific example used to discuss the relationship between a diameter of an ion flow and magnetic flux density of a magnetic field generated with electromagnetic coils according to the first embodiment.
Figure 6:
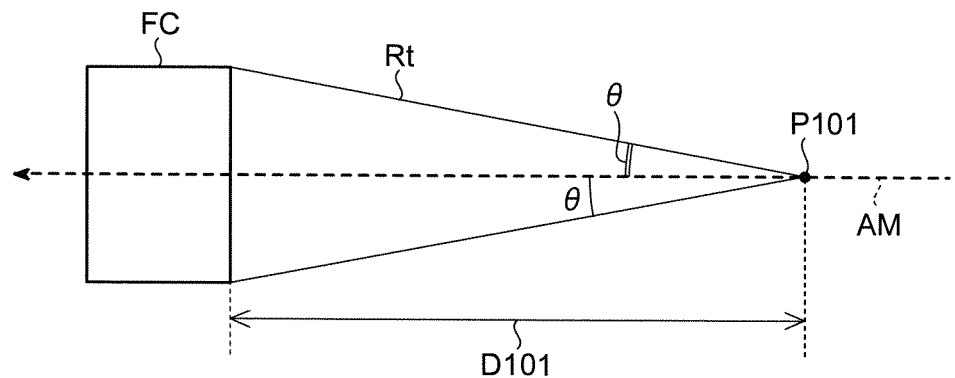
FIG. 6 is a schematic diagram illustrating the relationship between a collection solid angle and a collectible range according to the first embodiment.

In the example shown in FIG. 5, a distance D101 from the tin plate 107 to the fluorescent screen PS, which corresponds to the distance from the plasma generation region P1 to the ion collection unit 24 or 25, has been set to 100 mm. The pressure inside a chamber (corresponding to the chamber 1) has been set below $1 \times 10^{-4}$ Pa. The collection solid angle of the Faraday cup FC has been set to 0.15 sr (steradian). FIG. 6 schematically illustrates the relationship among the plasma generation region P101, the Faraday cup FC used to measure the amount of the ions, and the range within which the ions can be detected with the Faraday cup FC. In this measurement, the range of the detectable area in the Faraday cup FC is assumed to coincide with the collectible range. When the collection solid angle is set to 0.15 sr, a divergence angle θ from the magnetic axis AM (corresponding to the central axis A3) of the collectible range Rt has been 12.5 degrees (216 mrad). That is, the plasma generation region P101 being assumed to be on the magnetic axis AM, the Faraday cup FC can receive substantially the entirety of the ion flow FL101 that has diverged to 44.2 mm in diameter. Under this condition, the magnetic flux density of the magnetic field generated with the superconductive magnet 121 in the plasma generation region P101 located on the tin plate 107 has been varied from 0 to 1.7 T (tesla).

When, for example, the tin plate 107 is irradiated with the laser beam L101 at the wavelength of 1064 nm and with the pulse width of 5 ns using Nd:YAG laser, ions generated from the tin plate 107 may be trapped in the magnetic field generated with the superconductive magnet 121, whereby the ion flow FL101 drifting from the tin plate 107 to the Faraday cup FC along the magnetic axis AM may be formed. When the diameter of the ion flow FL101 is to be measured, the fluorescent screen PS and the CCD camera 115 for observing the fluorescent screen PS are disposed in front of the Faraday cup FC, whereby the drifting ion flow FL101 may be incident on the fluorescent screen PS disposed in front of the Faraday cup FC and the fluorescent ion spot $P_{ion}$ may be formed. The ion spot $P_{ion}$ formed on the fluorescent screen PS with the ion flow FL101 may be observed with the CCD camera 115. Accordingly, analyzing the image from the CCD camera 115 makes it possible to measure the diameter of the ion flow FL101. When the amount of the ions is to be measured, the fluorescent screen PS and the CCD camera 115 may be removed. With this, the amount of the ions in the ion flow FL101 may be determined by measuring the electric current flowing in the Faraday cup FC.

Figure 7:
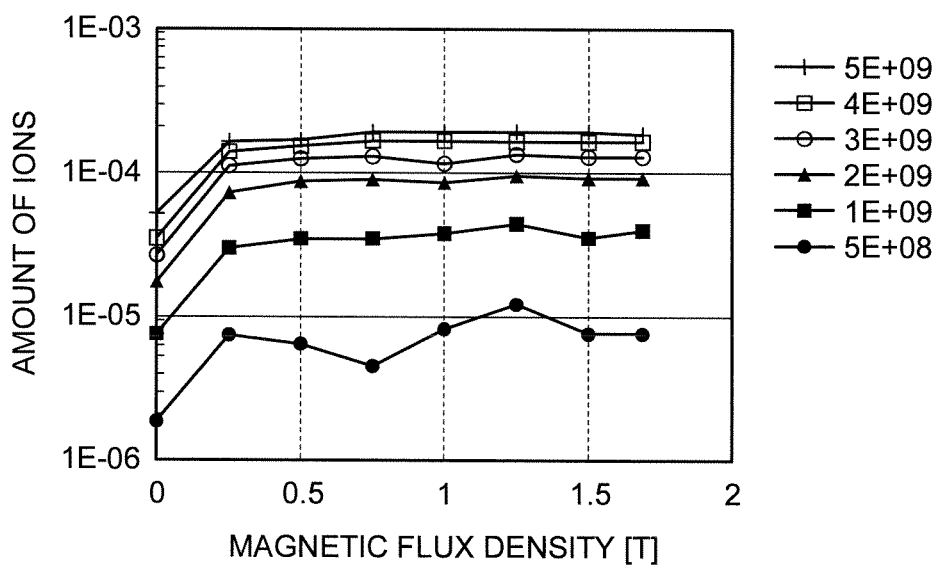
FIG. 7 illustrates the amount of ions observed in a Faraday cup, when the magnetic flux density of the magnetic field generated with a superconductive magnet is varied from 0 to 1.7 T in the specific example shown in FIG. 5.

FIG. 7 shows the amount of the ions observed in the Faraday cup FC, when the magnetic density of the magnetic field generated with the superconductive magnet 121 of the specific example shown in FIG. 5 is varied from 0 to 1.7 T. FIG. 7 shows the amount of the ions observed in cases where the intensity of the laser beam from the Nd:YAG laser is varied respectively to $5\times10^8$ W/cm$^2$, $1\times10^9$ W/cm$^2$, $2\times10^9$ W/cm$^2$, $3\times10^9$ W/cm$^2$, $4\times10^9$ W/cm$^2$, and $5\times10^9$ W/cm$^2$. As shown in FIG. 7, the magnetic flux density of the magnetic field being set at or above 0.25 T, the amounts of the ions observed in the Faraday cup PC are substantially constant in any of the cases where the intensity of the laser beam from the Nd:YAG laser is varied respectively to $5\times10^8$ W/cm$^2$, $1\times10^9$ W/cm$^2$, $2\times10^9$ W/cm$^2$, $3\times10^9$ W/cm$^2$, $4\times10^9$ W/cm$^2$, and $5\times10^9$ W/cm$^2$. This indicates that, when the divergence angle θ from the center of the collectible range is 12.5 degrees, setting the magnetic flux density at or above 0.25 T may allow substantially the entirety of the ions to be incident on the Faraday cup FC.

Figure 8:
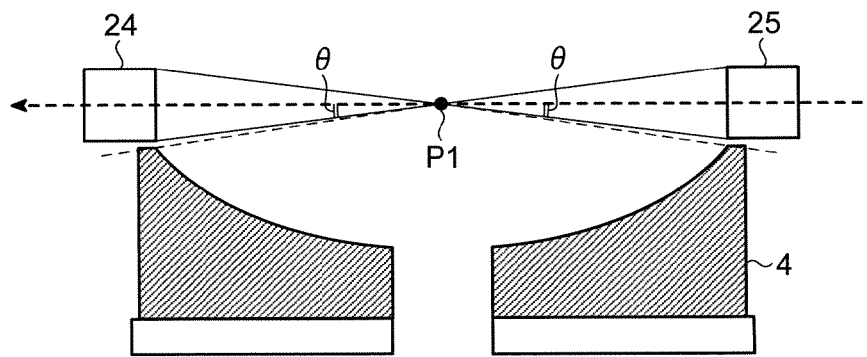
FIG. 8 schematically illustrates the relationship among an ion collection unit, an EUV collector mirror, and a divergence angle of ions generated in the plasma generation region according to the first embodiment.

Accordingly, as illustrated in FIG. 8, it should be appreciated that substantially the entirety of the ions generated in the plasma generation region P1 can be collected into the ion collection units 24 and 25, without allowing the ions to be incident on optical elements such as the EUV collector mirror 4, if the magnetic flux density of the magnetic field B1 in the plasma generation region P1 is set at or above 0.25 T, under the condition where the distance from the plasma generation region P1 to the ion collection units 24 and 25 is set to 100 mm and the divergence angle θ from the center of the collectible range Rt with the ion collection units 24 and 25 is 12.5 degrees. In other words, it should be appreciated that the optimal range of the magnetic flux density of the magnetic field B1 is at or above 0.25 T. FIG. 8 schematically illustrates the relationship among the ion collection units, the EUV collector mirror, and the divergence angle of the ions according to the first embodiment.

Figure 9:
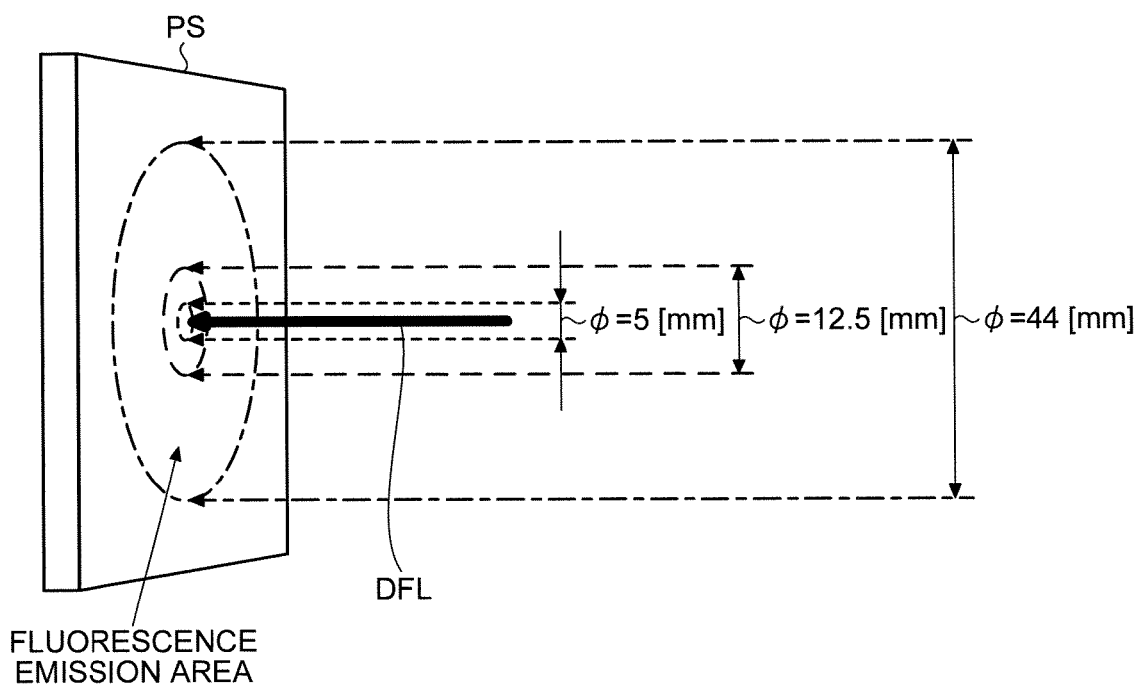
FIG. 9 is a schematic diagram illustrating the measurement result of fluorescence emission of a fluorescent screen observed by a CCD camera, when the magnetic flux density of the magnetic field generated with the superconductive magnet is varied to 0.25 T, 0.5 T, and 1.5 T in the specific example shown in FIG. 5.

Next, the optimal range of the magnetic flux density of the magnetic field B1 will be determined based on the result from the case where the fluorescent screen PS and the CCD camera 115 are used. FIG. 9 shows the emission area on the fluorescent screen PS observed with the CCD camera, when the magnetic flux density of the magnetic field generated with the superconductive magnet 121 is varied from 0 to 1.7 T in the specific example shown in FIG. 5. FIG. 9 shows the case where ion flows FL101a, FL101b, and FL101c generated when the magnetic flux density of the magnetic field is set to 0.25 T, 0.5 T, and 1.5 T, respectively, are incident on the fluorescent screen PS in the direction DFL of the ion flows.

Figure 10:
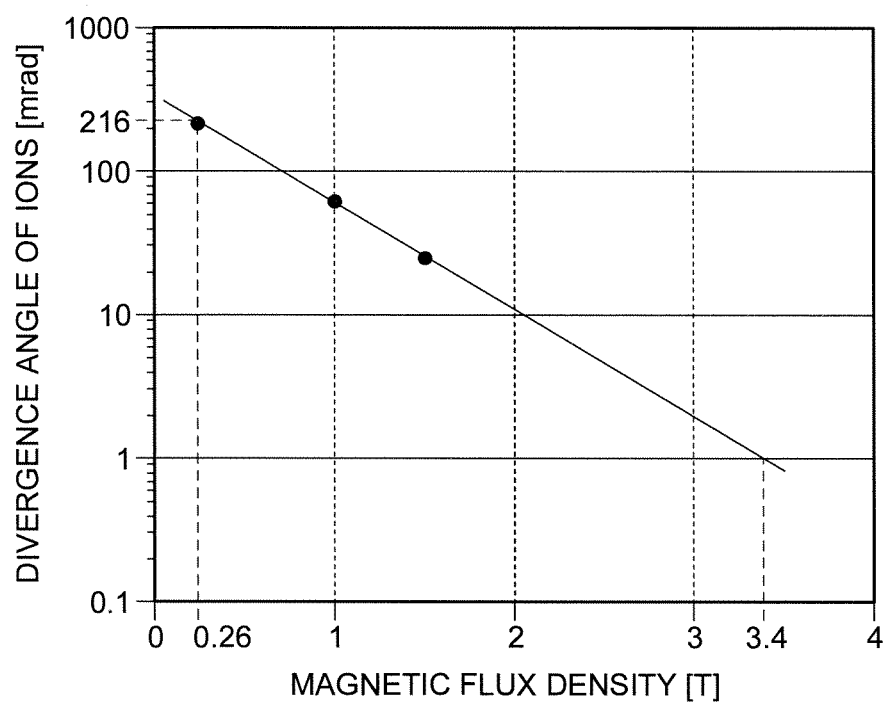
FIG. 10 is a correlation chart illustrating the relationship between the diameter of the ion flow and the magnetic flux density, when the magnetic flux density of the magnetic field generated with the superconductive magnet is varied in the specific example shown in FIG. 5.

FIG. 10 is a correlation chart showing the result of measured diameters of the emission area on the fluorescent screen PS observed with the CCD camera when the magnetic flux density of the magnetic field generated with the superconductive magnet is varied to 0.25 T, 0.5 T, and 1.5 T in the specific example shown in FIG. 5. When the magnetic flux density is set to 0.25 T, the diameter of the ion flow FL101a is approximately 44 mm. When the magnetic flux density is set to 0.5 T, the diameter of the ion flow FL101b is approximately 12.5 mm. When the magnetic flux density is set to 1.5 T, the diameter of the ion flow FL101c is approximately 5 mm. These results have been plotted on a graph with the divergence angle θ of the ions as the ordinate in the logarithmic scale and the magnetic flux density as abscissa in the linear scale, and the logarithmic function has been fitted on the graph using the least squares method, whereby the graph shown in FIG. 10 is obtained. FIG. 10 is a correlation chart showing the relationship between the diameter of the ion flow and the magnetic flux density when the magnetic flux density of the magnetic field generated with the superconductive magnet is varied in the specific example shown in FIG. 5.

In the correlation chart shown in FIG. 10, the logarithmic function obtained from the fitting using the least squares method is $\theta = 337.6 e^{-1.722B}$. As is apparent from FIG. 10, it should be appreciated that substantially the entirety of the ions generated in the plasma generation region P1 can be collected into the ion collection units 24 and 25, without allowing the ions to be incident on optical elements such as the EUV collector mirror 4, if the magnetic flux density of the magnetic field B1 in the plasma generation region P1 is set at or above 0.26 T, under the condition where the distance from the plasma generation region P1 to the ion collection units 24 and 25 is set to 100 mm and the divergence angle θ from the center of the collectible range Rt with the ion collection units 24 and 25 is 12.5 degrees (216 mrad or 0.15 sr in solid angle). In other words, it should be appreciated that the optimal range of the magnetic flux density of the magnetic field B1 is at or above 0.25 T.

Meanwhile, if the divergence angle θ of the ion flow FL is required to be at or below 1 mrad (0.1 degree), the magnetic flux density needs to be at or above 3.4 T. However, if the magnetic flux of the magnetic field needs to be this large, the electromagnetic coils 21 and 22 with which the magnetic field is generated and the power source for supplying electric current to the electromagnetic coils 21 and 22 also need to be made larger. As can bee seen from FIG. 10, however, the effectiveness in ion collection obtained with such a configuration is negligible. Thus, from the view point of the scale (or size) of the magnetic field generation unit, the magnetic flux density smaller than 3.4 T is preferable.

Based on the above, it should be appreciated that substantially the entirety of the ions generated in the plasma generation region P1 can be collected into the ion collection units 24 and 25, without excessively increasing the system in size, if the magnetic flux density of the magnetic field B1 in the plasma generation region P1 is set at or above 0.26 T and at or below 3.4 T, under the condition where the distance from the plasma generation region P1 to the ion collection units 24 and 25 is set to 100 mm and the divergence angle θ from the center of the collectible range Rt with the ion collection units 24 and 25 is 12.5 degrees (216 mrad).

From the above, it should be appreciated that substantially the entirety of the ions generated in the plasma generation region P1 can be collected into the ion collection units 24 and 25, without excessively increasing the system in size and without allowing the ions to be incident on optical elements such as the EUV collector mirror 4, if the magnetic flux density of the magnetic field B1 in the plasma generation region P1 is set at or above 0.26 T and at or below 3.4 T, under the condition where the distance from the plasma generation region P1 to the ion collection units 24 and 25 is set to 100 mm and the divergence angle θ from the center of the collectible range Rt with the ion collection units 24 and 25 is 12.5 degrees (216 mrad). In other words, it should be appreciated that performance deterioration of the optical elements disposed inside the chamber 1 can be suppressed while the system is prevented from being increased in size. Accordingly, in the first embodiment, it is preferable that the magnetic flux density of the magnetic field B1 in the plasma generation region P1 is set at or above 0.26 T and at or below 3.4 T.

Second Embodiment

An EUV light generation system according to a second embodiment of this disclosure will be described in detail with reference to the drawings. In the first embodiment described above, the ion collection units 24 and have been disposed outside an area defined by the periphery of the reflective surface of the EUV collector mirror 4. In the second embodiment, on the other hand, the ion collection units 24 and 25 are disposed such that at least the leading ends thereof are within an obscuration region of the EUV light L2. Note that the obscuration region refers to a region corresponding to an angle range within which EUV light collected by the EUV collector mirror is not used for exposure in the exposure apparatus. That is, the obscuration region is a three-dimensional region contained within the angle range of the EUV light that is not used in the exposure apparatus.

Figure 11:
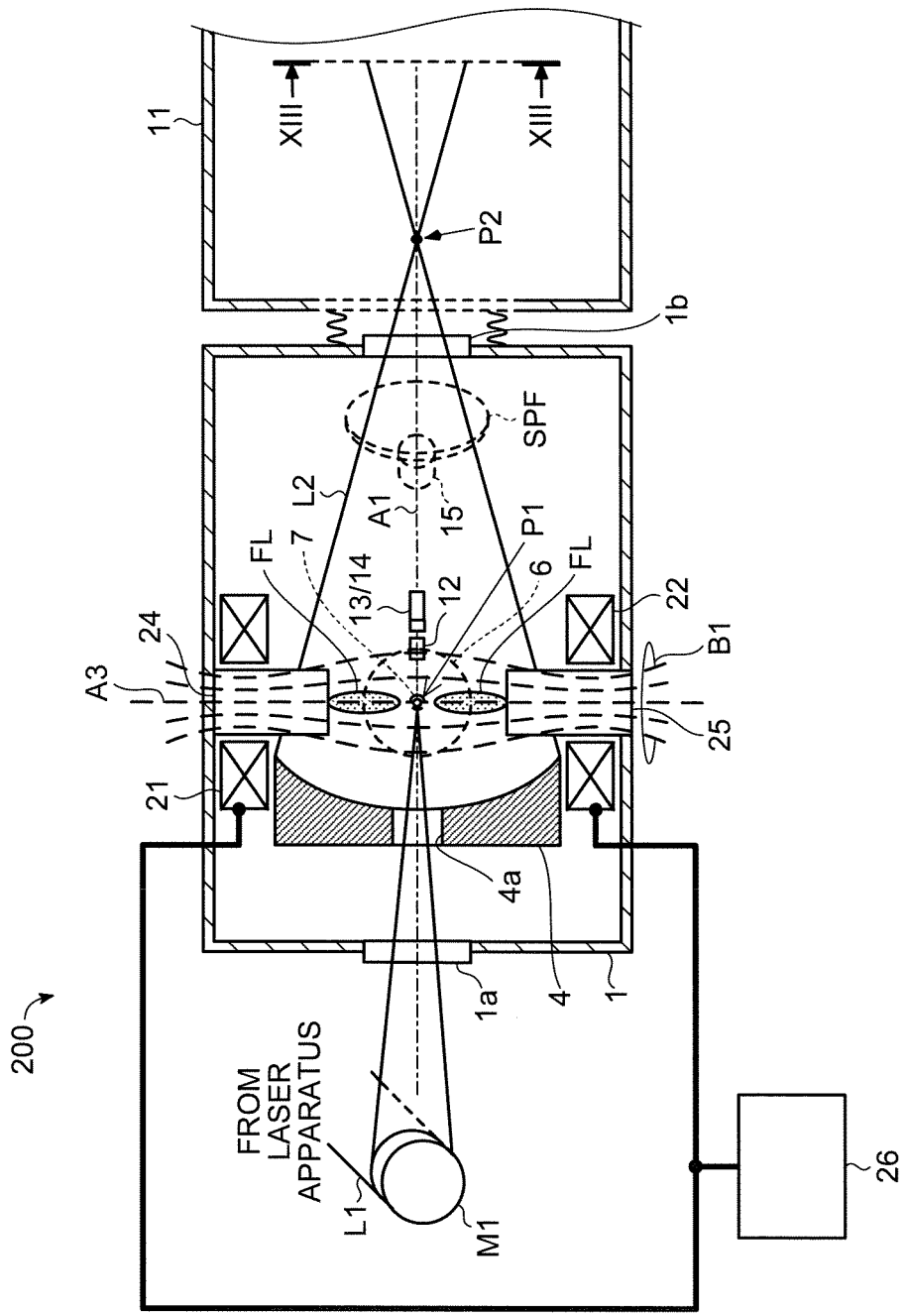
FIG. 11 is a sectional view, taken along a plane containing the axis of the EUV light and the axis of the magnetic flux of the magnetic field generated with the electromagnetic coils, schematically illustrating the configuration of an EUV light generation system according to a second embodiment of this disclosure.

FIG. 11 schematically illustrates the configuration of the EUV light generation system according to the second embodiment. As is apparent when FIG. 11 is compared with FIG. 2, an EUV light generation system 200 shown in FIG. 11 is similar in configuration to the EUV light generation system shown in FIG. 2, but parts of the ion collection units 24 and 25 extend over the reflective surface of the EUV collector mirror 4. In addition, in the EUV light generation system 200, the pair of electromagnetic coils 21 and 22 for generating the magnetic field B1 in the plasma generation region P1 is disposed inside the chamber 1.

Figure 12:
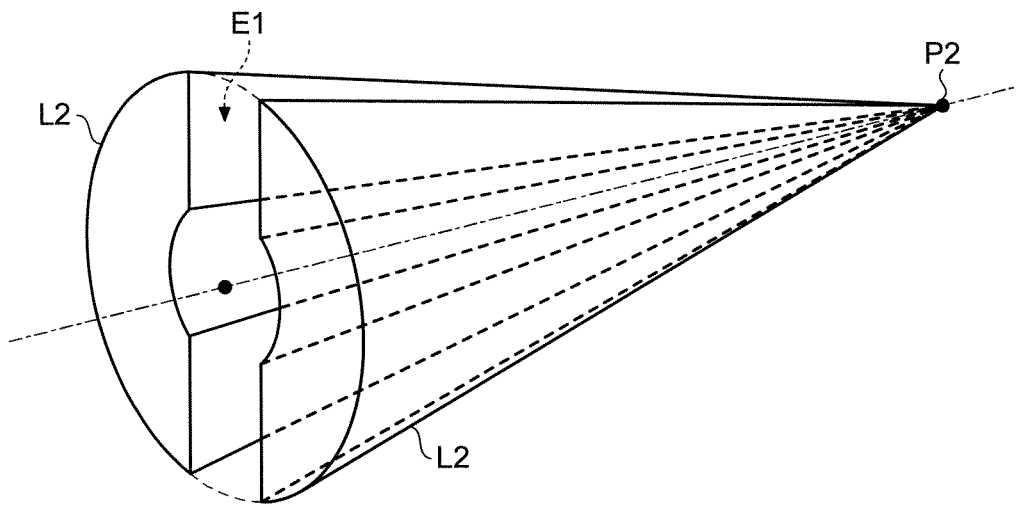
FIG. 12 schematically illustrates a space through which the EUV light reflected by the EUV collector mirror shown in FIG. 11 passes.
Figure 13:
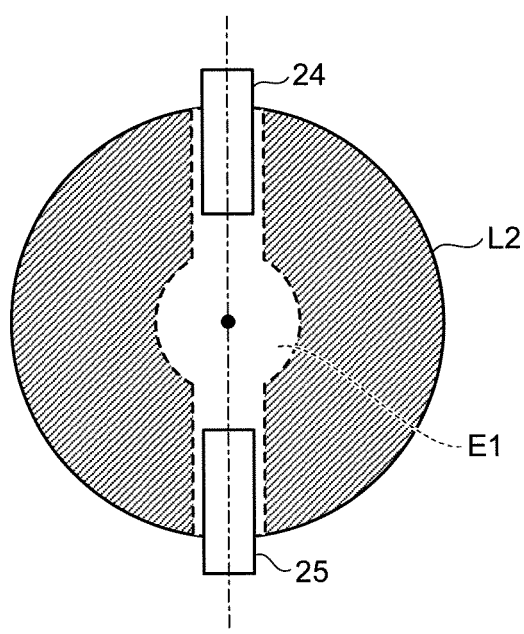
FIG. 13 illustrates a far-field pattern of the EUV light along XIII-XIII plane in the EUV exposure apparatus of FIG. 11.

FIG. 12 schematically illustrates a space through which the EUV light L2 travels in the exposure apparatus 11 side from the intermediate focus P2 shown in FIG. 11. FIG. 13 shows a far-field pattern of the EUV light L2 along XIII-XIII plane in the EUV exposure apparatus 11 shown in FIG. 11. In FIG. 13, for the sake of clarity, projection region of the ion collection units 24 and 25 are shown within the obscuration region of the far-field pattern; however, this does not mean that the ion collection units 24 and 25 are disposed on XIII-XIII plane.

Figure 14:
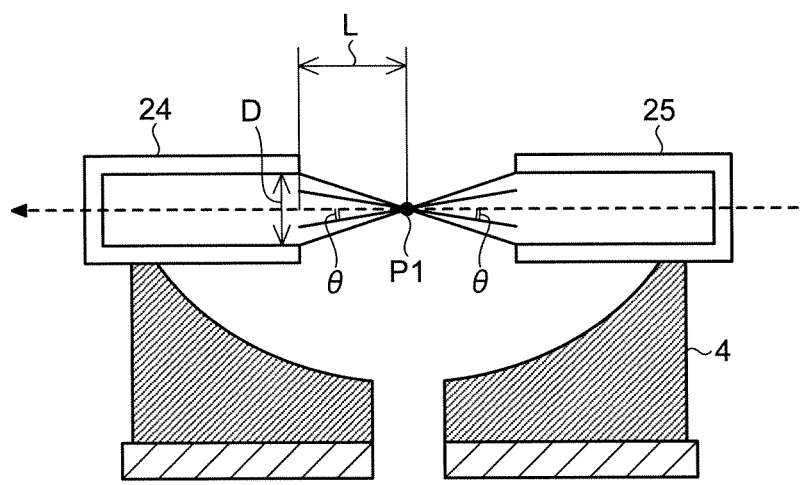
FIG. 14 illustrates the positional relationship between the ion collection unit and the EUV collector mirror of FIG. 11.

As illustrated in FIG. 12, the space through which the EUV light L2 travels is conical in shape with the intermediate focus P2 being the vertex thereof. At the center portion of the space, a zonal region that divides the conical space in half along the direction in which the EUV light L2 travels exists. This zonal space is an obscuration region E1. Thus, as illustrated in the far-field pattern shown in FIG. 13, in the second embodiment, the leading ends of the respective ion collection units 24 and 25 may be allowed to extend into the obscuration region E1. Specifically, as illustrated in FIG. 14, the ion collection units 24 and 25 are disposed such that the leading ends thereof extend over the reflective surface of the EUV collector mirror 4. The ion collection units 24 and 25 are provided with openings at the leading ends thereof for collecting the ions into the ion collection units 24 and 25. Hereinafter, these openings will be referred to as collection ports.

Here, the divergence angle θ of the ions generated in the plasma generation region P1 can be expressed in Expression (2) below.

$$\theta = \tan^{-1}\{D/(2 \cdot L)\} \quad (2)$$

Here, D represents the diameter of the collection port, and L represents the distance from the plasma generation region P1 to the collection port.

Further, Expression (3) below has been obtained from the relationship between the divergence angle of the ions generated in the plasma generation region P1 and the magnetic flux density of the magnetic field B1 generated in the plasma generation region P1 based on the experimental results.

$$\theta = 337.6 e^{-1.722B} \quad (3)$$

Here, B represents the magnetic flux density of the magnetic field B1.

Arranging the electromagnetic coils 21 and 22 and the ion collection units 24 and 25 such that Expressions (2) and (3) are satisfied makes it possible to improve the ratio of collected ions with respect to the generated ions (collection rate) even when the divergence angle θ of the ions is relatively large. For example, when the electromagnetic coils are reduced in size, the intensity of the magnetic field B1 may also be reduced. In this case, the divergence angle θ of the ions is increased. Even if this is the case, arranging the ion collection units 24 and appropriately using Expressions (2) and (3) makes it possible to collect the ions at a high collection rate, whereby the amount of debris adhering to the optical elements such as the EUV collector mirror 4 can be reduced.

As shown in FIG. 11, disposing the ion collection units 24 and 25 such that the leading ends thereof are located within the obscuration region E1 may improve design and arrangement flexibility. In the second embodiment illustrated in FIG. 11, the ion collection units 24 and 25 shown in FIG. 11 are extended in length compared to the ion collection unit 24 and 25 shown in FIG. 2. However, the embodiment is not limited thereto, as long as the leading ends of the ion collection units 24 and 25 are located within the obscuration region E1.

The ion collection units 24 and 25 shown in FIGS. 2 and 11 may preferably be configured of a magnetic material. When the ion collection units 24 and 25 are configured of a magnetic material, the magnetic flux generated with the electromagnetic coils can be guided thereto. When the leading ends of the ion collection units 24 and 25 are located within the obscuration region E1 and the ion collection units 24 and 25 are configured of a magnetic material as in the second embodiment, a strong magnetic field can be generated locally in the plasma generation region P1. Accordingly, the electromagnetic coils 21 and 22 can be reduced in size. Note that magnetic materials include metals such as iron, cobalt, and nickel, and an alloy thereof. Further, at least the surfaces of the ion collection units 24 and 25 may preferably be configured of a material that has low wettability to the target material (tin in this embodiment) and that is highly resistant to ion sputtering. Alternatively, the surfaces of the ion collection units 24 and 25 may be coated with a material that has low wettability to the target material and that is highly resistant to ion sputtering. Materials that have low wettability to the target material and that are highly resistant to ion sputtering may include CVD-SiC, carbon, or the like. With such a configuration, damage from materials scattered from the target material, the plasma, and so on, to the ion collection units 24 and 25 disposed in the obscuration region E1 close to the plasma generation region P1 can be reduced.

Other configurations are similar to those of the above-described first embodiment or of the modification thereof; thus, the duplicate description thereof is omitted here.

The above-described embodiments and the modifications thereof are merely examples for implementing this disclosure, and this disclosure is not limited thereto. Making various modifications according to the specifications or the like is within the scope of this disclosure, and it is apparent from the above description that other various embodiments are possible within the scope of this disclosure. For example, it is needless to state that the modifications illustrated for each of the embodiments can be applied to other embodiments as well.

What is claimed is:

1. A chamber apparatus used with a laser apparatus and an external apparatus having an obscuration region, the chamber apparatus comprising:
  a chamber provided with at least one inlet through which a laser beam outputted from the laser apparatus enters the chamber;
  a target supply unit provided to the chamber for supplying a target material to a predetermined region inside the chamber;
  an electromagnet for generating a magnetic field by being supplied with an electric current, a central magnetic flux of the magnetic field being inclined with respect to a target track along which the target material outputted from the target supply unit travels;
  a power source configured to supply the electric current to the electromagnet so that the magnet field with a magnetic flux density B at the predetermined region is generated;
  a pair of charged particle collection units located in the central magnetic flux of the magnetic field while sandwiching the predetermined region, each of the charged particle collection units having an opening for collecting charged particles being generated when the target material is irradiated with the laser beam at the predetermined region, the charged particle travelling along the magnetic flux while diffusing within an angular range with a divergence angle $\theta$ given by an Expression $\theta=337.6e^{-1.722B}$, a diameter of the opening being greater than a diameter of an ion flow formed by the charged particles; and
  a collector mirror disposed inside the chamber for collecting extreme ultraviolet light emitted when the target material is irradiated with the laser beam inside the chamber,
  wherein at least a part of the pair of charged particle collection units is disposed within a range corresponding to the obscuration region over the collector mirror.

2. The chamber apparatus according to claim 1, wherein the target material is a droplet of tin.

3. The chamber apparatus according to claim 1, wherein the target material is a solid target of tin.

4. An extreme ultraviolet light generation system, comprising:
  the chamber apparatus according to any one of claims 1, 2 and 3; and
  a laser apparatus.

5. The chamber apparatus according to claim 1, wherein the magnetic flux density B of the magnetic field in the predetermined region is approximately at or above 0.26 tesla and approximately at or below 3.4 tesla.

6. The chamber apparatus according to claim 1, wherein the target material is a droplet of tin.

7. The chamber apparatus according to claim 1, wherein the target material is a solid target of tin.

* * * * *